(12) United States Patent
Shao et al.

(10) Patent No.: US 12,127,372 B2
(45) Date of Patent: Oct. 22, 2024

(54) ELECTRONIC RACK FLUID DISTRIBUTION SYSTEM

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 492 days.

(21) Appl. No.: 17/029,867

(22) Filed: Sep. 23, 2020

(65) Prior Publication Data
US 2022/0095483 A1    Mar. 24, 2022

(51) Int. Cl.
H05K 7/20    (2006.01)

(52) U.S. Cl.
CPC ..... H05K 7/20272 (2013.01); H05K 7/20781 (2013.01)

(58) Field of Classification Search
CPC .......... H05K 7/20272; H05K 7/20781; H05K 7/20772; H05K 7/2079
USPC ........................................................ 165/80.4
See application file for complete search history.

(56) References Cited

U.S. PATENT DOCUMENTS

| 9,016,352 B2 * | 4/2015 | Helbig ................. F28F 9/007 361/695 |
| 2020/0249732 A1 * | 8/2020 | Nakamura ......... H05K 7/20709 |
| 2022/0210954 A1 * | 6/2022 | Yuan .................. H05K 7/20754 |

* cited by examiner

*Primary Examiner* — Jon T. Schermerhorn, Jr.
(74) *Attorney, Agent, or Firm* — WOMBLE BOND DICKINSON (US) LLP

(57) ABSTRACT

A fluid manifold includes a fluid port near to a first end of a fluid manifold, the fluid manifold having an elongated design extending from the first end to a second end. The fluid manifold also includes a number of distributing ports disposed along a length of the fluid manifold between the first end and the second end. The length and form factor of the manifold, and the distribution ports including port number as well as their distances are innovatively designed for different rack configurations. Each distributing port is configured to engage with a flexible hose connected to a cooling system of an electronic device. Rack manifolds with the same design can support different server arrangements in a liquid cooled IT rack. The fluid manifold also includes a mounting mechanism configured to engage with an opening defined in a portion of a back panel of an electronic rack.

19 Claims, 12 Drawing Sheets

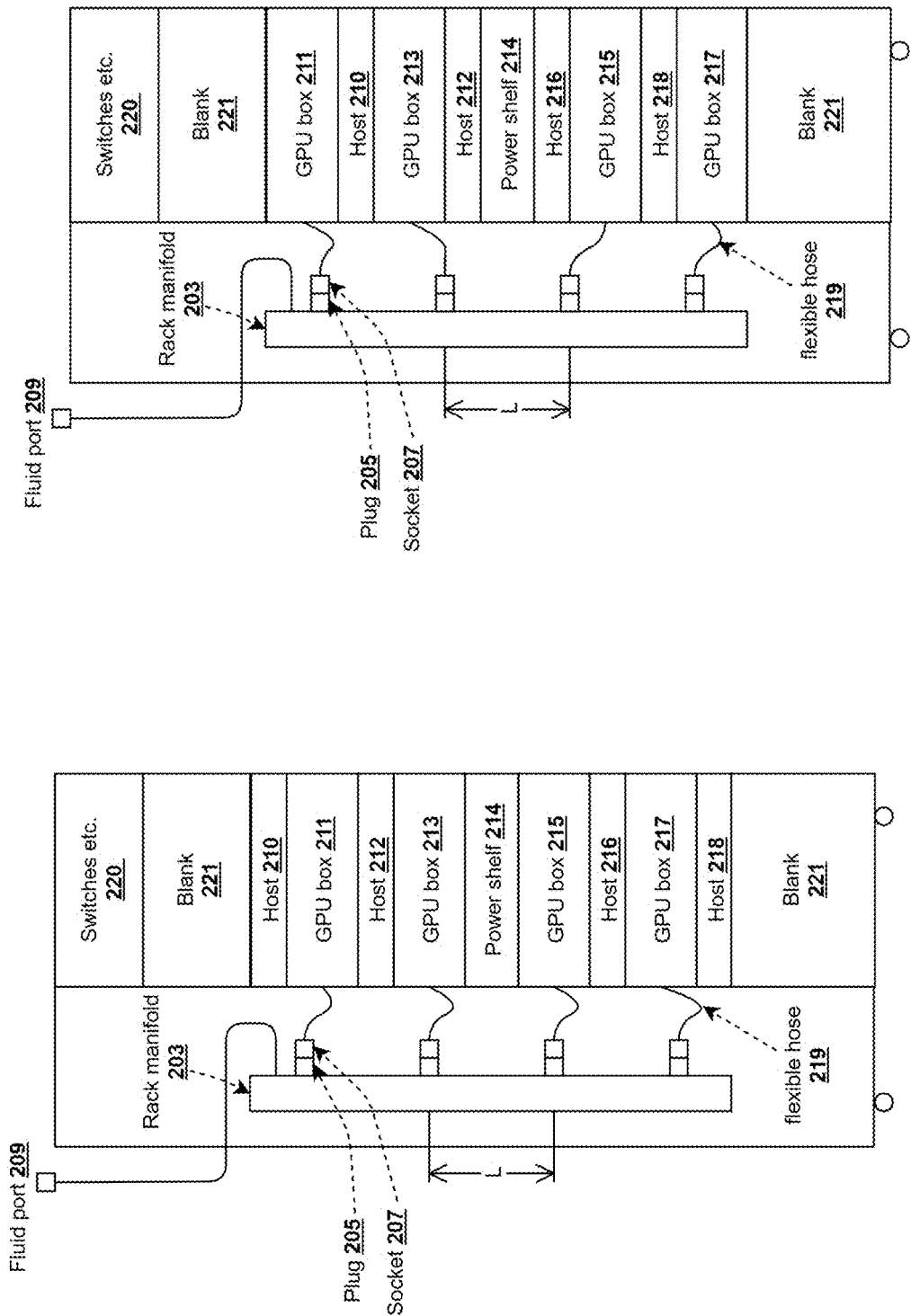

ELECTRONIC RACK FLUID DISTRIBUTION SYSTEM

FIELD OF THE DISCLOSURE

Embodiments of the present invention relate generally to electronic cooling systems. More particularly, embodiments of the invention relate to a fluid distribution system for an electronic rack.

BACKGROUND

Data centers are mission critical facilities which are used for housing IT equipment and servers. The variation in business requirements and use cases, variation in computing power requirements, etc. cause significant variation in IT equipment design. The variations in the IT design include the variation in different type of server management solutions. The cooling system for such data centers is critical and raises a number of non-trivial challenges.

BRIEF DESCRIPTION OF THE DRAWINGS

Embodiments of the invention are illustrated by way of example and not limitation in the figures of the accompanying drawings in which like references indicate similar elements.

FIGS. 2A-2E show example server arrangements that can be supported using a single rack manifold, according to an embodiment of the present disclosure.

DETAILED DESCRIPTION

Figure 1:
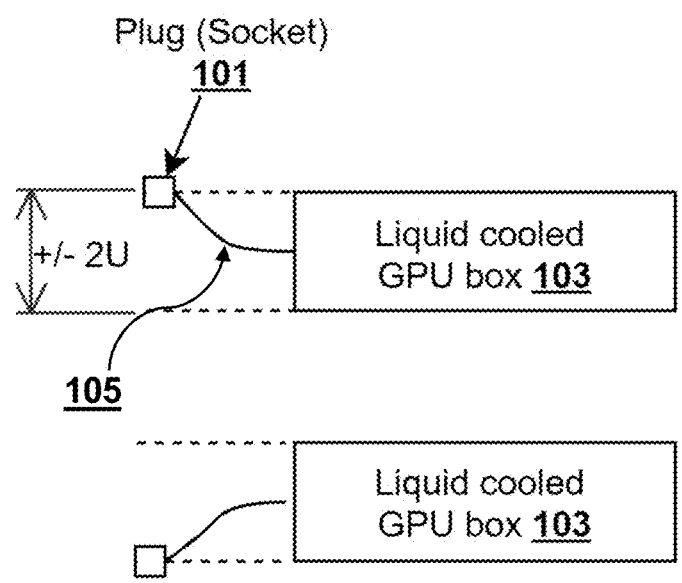
FIG. 1 shows an example socket connected to a liquid cooled GPU box via a flexible hose, according to the prior art.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

In some embodiments, rack manifolds can be used to distribute fluid into each server in a liquid cooled IT rack. Typically, the fluid ports are welded on the rack manifold body and their locations are not changeable after manufacturing. In the meantime, a IT rack may not be fully occupied with servers due to power supply limits, or other factors. For example, the maximum power supplied to an IT rack (e.g. one with a height of 46 U) is 20 kW, given a GPU box (4 U)+host (1 U) with 5 kW power consumption in total. In such an example, a maximum of 4 GPU boxes and 4 hosts can be mounted, with maybe 20 U blank rack space left. Furthermore, there are different ways to arrange GPU boxes and hosts in a IT rack, given a power shelf placed in the middle of the rack, and different power consumptions among GPU boxes and hosts. Power is delivered via a busbar in an IT rack from a power shelf to each server. Voltage/Energy loss may be significant on the busbar, especially for high power density servers, for example, a 5 kW GPU box mounted with a certain distance from a power shelf in a 48 U rack.

Server arrangement should be optimized to minimize the voltage/energy loss, which depends on the specific power consumption of each server. Therefore, a need exists for rack manifolds with one design, yet which can support different server arrangements in a liquid cooled IT rack. Such a rack manifold can save time when designing liquid cooling solutions and can bring down costs, especially in a scenario where rack manifolds are to be designed prior to a decided server arrangement plan. In some embodiments, the rack manifold can be designed much shorter than the IT rack height, which can also reduce costs.

Embodiments described herein provide for a rack manifold design that can accommodate a partially occupied IT rack and provide liquid cooling. In some embodiments, the rack manifolds disclosed herein are able to support different server arrangements in a partially occupied IT rack. In some embodiments, the rack manifolds are movable with respect to a back panel of the IT rack, or with respect to the servers within the IT rack, such that the rack manifolds can match a new server arrangement. The fastening or mounting mechanism described herein can allow for easy movement of the rack manifolds. In some embodiments, two manifolds can connect in series and work together, in a case where more servers may be deployed in the same IT rack. In some embodiments, an inlet manifold and an outlet manifold can be mounted at different heights in an IT rack. Such a configuration can be beneficial, especially when a phase change fluid is used, or to provide more space for maintenance and improve serviceability.

In some embodiments, the rack manifolds discussed in this disclosure can be shorter than the full height of an IT rack, to support partially occupied IT racks with liquid cooling. The rack manifold can include a primary fluid port, which can be a fluid inlet port for an inlet manifold or a fluid outlet port for an outlet manifold. The rack manifold can also include a number of ports disposed along the length of the manifold, which can be distributing ports for supplying cooling fluid to a server in the case of an inlet manifold, or receiving fluid from a server cooling device in the case of an outlet manifold. Quick disconnect (QD) plugs (or sockets) can be attached to ports on the rack manifold. The hose extended from a liquid cooled GPU box can have a QD socket which can connect with the ports of the rack manifold. Thus the hose can connect to the port on the manifold to allow liquid to travel into the server to take the heat away.

In some embodiments, the locations of the ports on the rack manifold can be uniformly distributed in space. The spacing of two adjacent ports can be predefined, and can be a multiple of the basic unit of height of the IT rack, i.e. "U." With a specially predefined part spacing, the rack manifold is able to support different server arrangements in a liquid cooled IT rack.

The rack manifold can be mounted on a back panel of the IT rack using a fastening mechanism, such as threaded studs or fastening panels. With the fastening methods disclosed herein, the rack manifold can move up and down conveniently to support different rack configurations.

FIG. 1 shows an example socket 101 connected to a liquid cooled GPU box 103 via a flexible hose 105, according to the prior art. In this embodiment, the flexible hose 105 can be connected to the liquid cooling module in a server or liquid cooled GPU box 103. The end of the hose 105 has the plug (or socket) 101 that can engage with a socket (or plug) on the distributing ports of a rack manifold. The length of this hose 105 allows a certain U-height range to connect a socket (or plug) attaching to a port on the rack manifold. For example, if the port on the rack manifold has a vertical distance within 2 U (where 1 U=46.5 mm in one standard) from the half-height location of the server, the hose segment is able to reach the port on the rack manifold. Otherwise, the hose segment cannot reach the port due to this port being too far from this server. In this disclosure, we defined this distance as the coverage of the hoses of the server. In one embodiment, the coverage is +/−2 U.

FIGS. 2A-2E show example server arrangements that can be supported using a single rack manifold 203, according to an embodiment of the present disclosure. In this embodiment, the IT rack is only partially occupied, and blank spaces 221 are present. In some embodiments, the rack manifold's specification is designed based on a number of factors to support different server arrangements. These factors include: the number of servers in the rack (how many hosts and how many GPU boxes), the rack space needs of hosts and GPU boxes (e.g. host=2 U rack space, and GPU box=4 U rack space), and the distance of two adjacent ports on the rack manifolds. In one example embodiment, a uniform port spacing of L=7 U is applied in order for the rack manifold 203 to support the arrangements of FIGS. 2A and 2E.

In this example embodiment, the rack manifold 203 is connected to fluid port 209 and has a number of plugs 205 which function as distributing ports for the rack manifold. The plugs 205 can connect with sockets 207, which can provide a fluid communication with the servers via a flexible hose 219. One skilled in the art will appreciate that, in some embodiments, the plug/socket arrangement can be reversed, such that the distributing ports of the rack manifold have sockets and the plugs are on the flexible hose/server side. The IT rack includes a portion for switches 220 and cable management kits, and also may have different sized blank spaces 221, depending on the server arrangement.

In this embodiment, a power shelf 214 is positioned generally at the middle portion of the IT rack, and different arrangements of hosts 210, 212, 216, 218 and GPU boxes 211, 213, 215, 217 can be arranged about the power shelf 214.

Table 1, below, provides details regarding the different server arrangements shown in FIGS. 2A-2E. According to these example embodiments, two manifolds, one for inlet and one for outlet, are used in each system, and bot share the same specifications.

TABLE 1

Figure 2D:
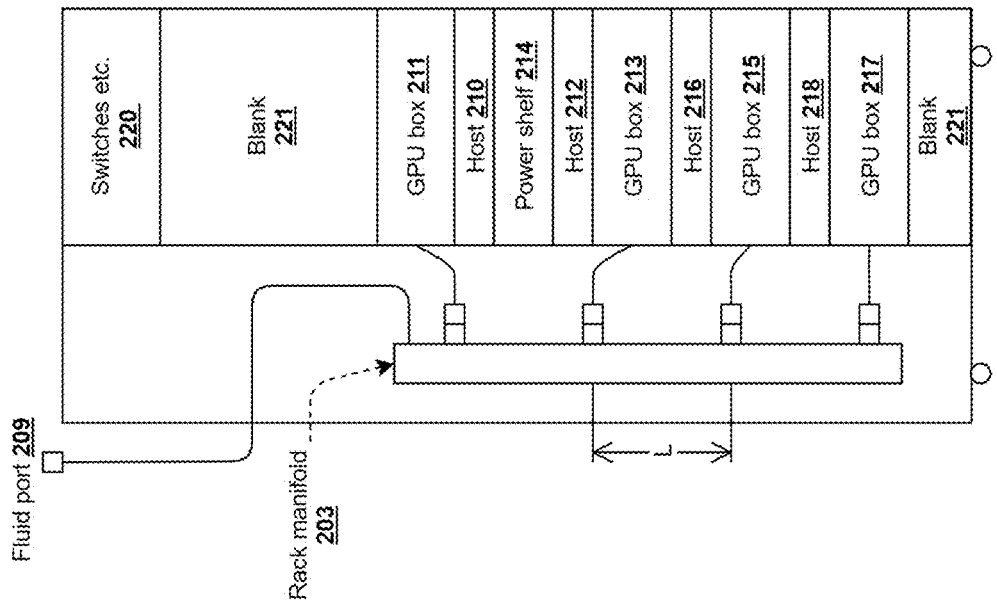
Figure 2C:
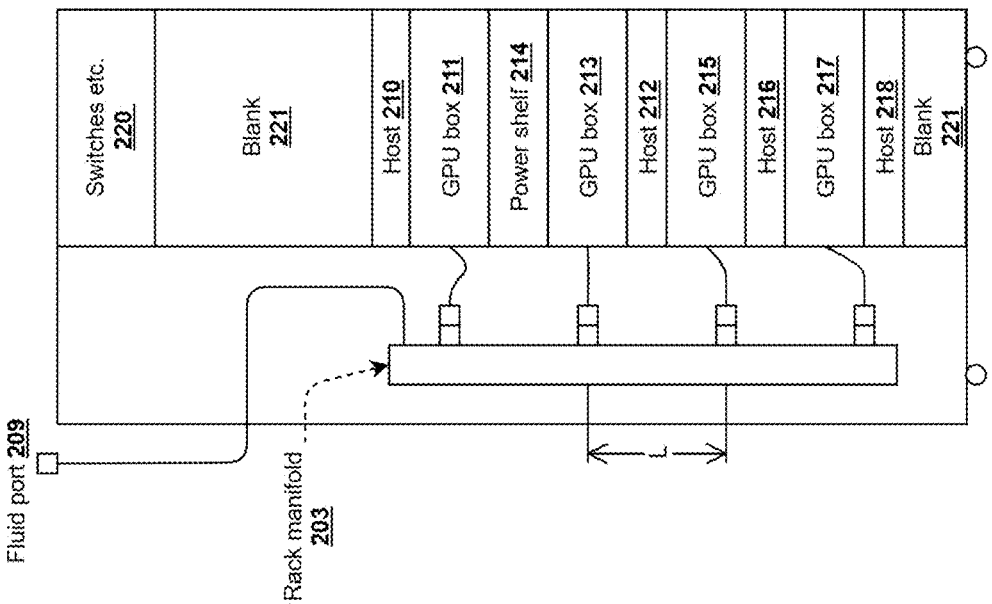
Figure 2E:
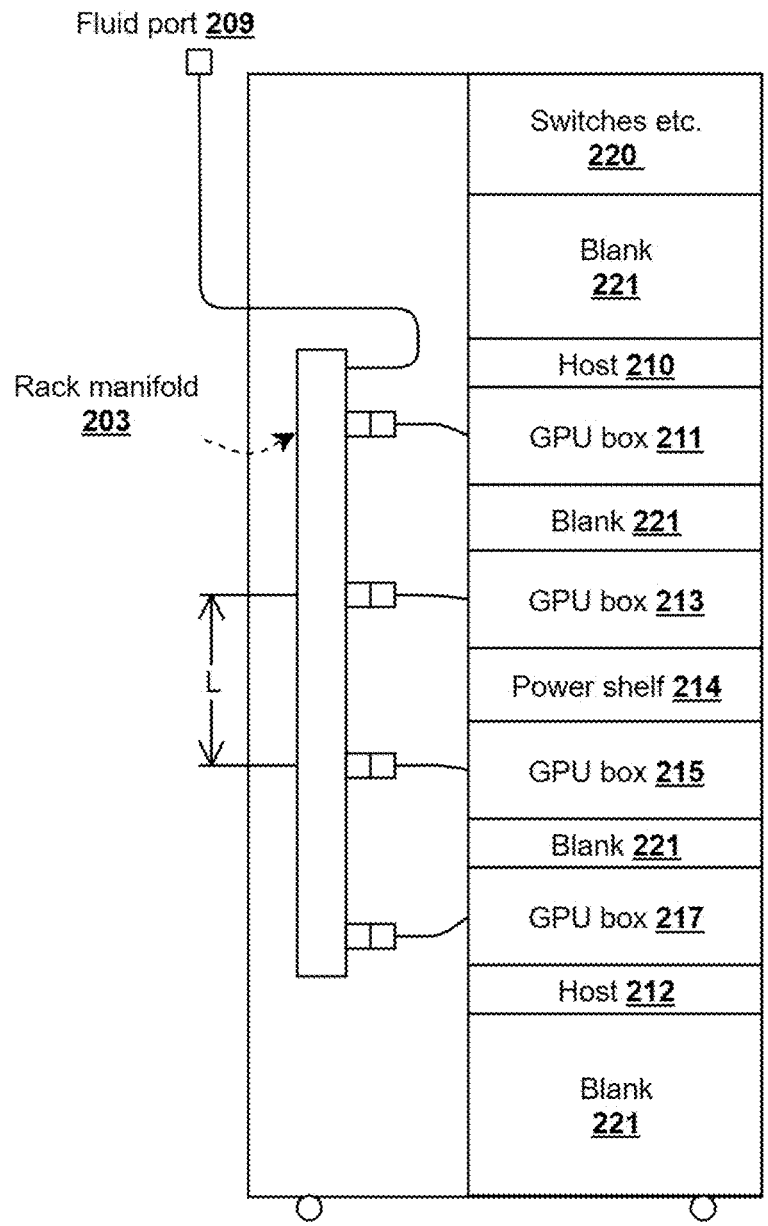

| Server arrangement | symmetric or asymmetric regarding power shelf | Host or GPU box closer to power shelf | Host/GPU box ratio |
|---|---|---|---|
| FIG. 2A | symmetric | GPU box | 1:1 |
| FIG. 2B | symmetric | host | 1:1 |
| FIG. 2C | asymmetric | GPU box | 1:1 |
| FIG. 2D | asymmetric | host | 1:1 |
| FIG. 2E | symmetric | GPU box | 1:2 |

As can be seen in Table 1, the server arrangements in FIGS. 2A, 2B, and 2E are symmetrically positioned about the power shelf 214, while the servers in FIGS. 2C and 2D are asymmetric. For each of FIGS. 2A-2D, there is a 1:1 ratio of host to GPU box, while in FIG. 2E host 210 serves GPU boxes 211 and 213, while host 212 serves GPU boxes 215 and 217.

Figures 3A, 3B:
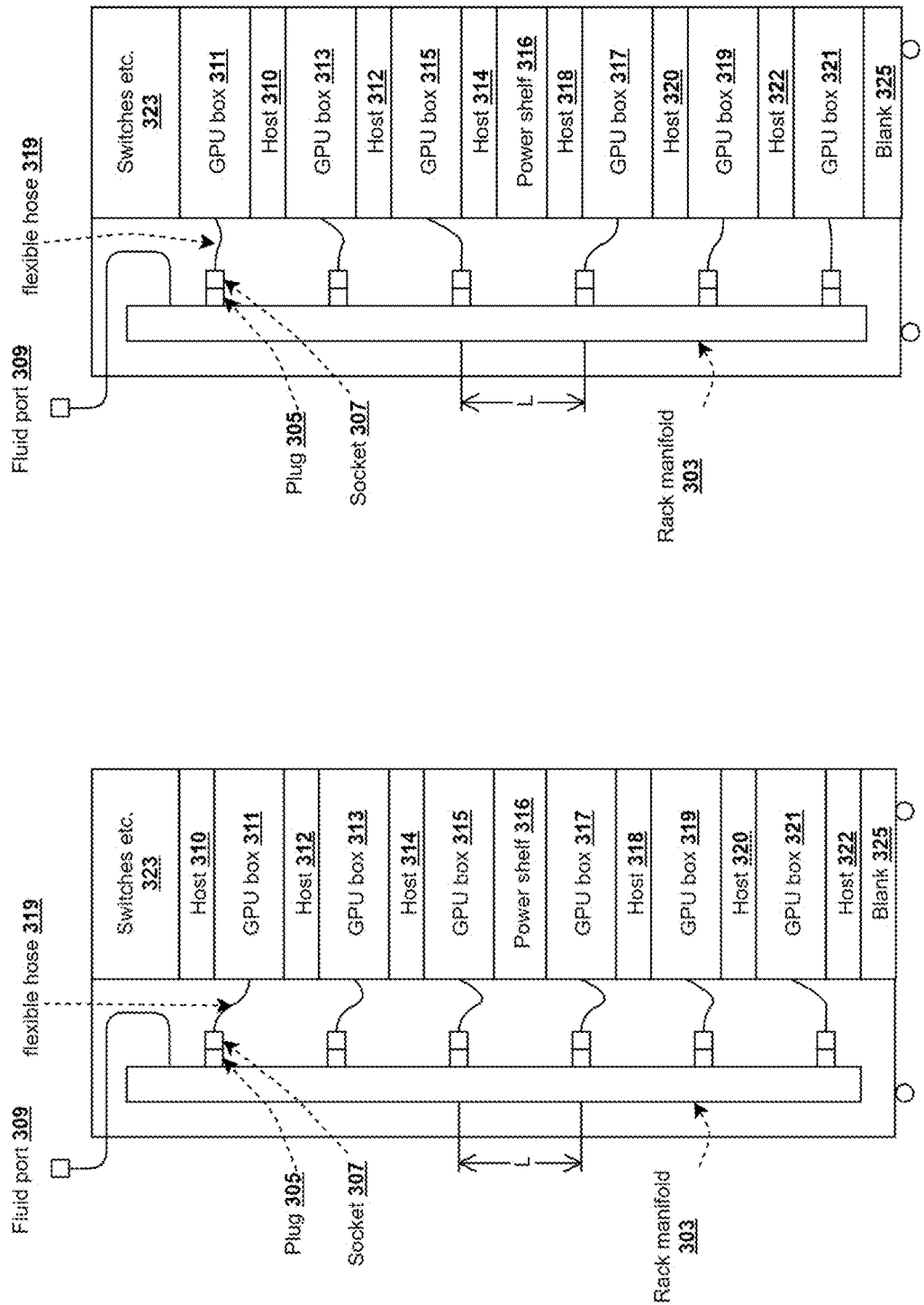
FIGS. 3A-3B show additional server arrangements that can be supported using a rack manifold, according to an embodiment of the present disclosure.

FIGS. 3A-3B show additional server arrangements that can be supported using a rack manifold 303, according to an embodiment of the present disclosure. In this embodiment, the rack manifold 303 is fluidly coupled with a fluid port 309 and includes a number of plugs 305 corresponding to distributing ports, that can fluidly connect with sockets 307. The sockets are in turn connected to the servers or GPU boxes via a flexible hose 319. In this embodiment, the IT rack includes a section for switches 323 and cable management kits, a power shelf 316, and a portion of blank space 325. The IT rack also includes a number of hosts 310, 312, 314, 318, 320, 322 and GPU boxes 311, 313, 315, 317, 319, 321.

In some embodiments, each distributing port corresponding to the plugs 305 is spaced a uniform distance L along the length of the rack manifold. To determine the uniform port spacing L, a rack manifold for a fully-occupied IT rack is designed first. For a fully occupied IT rack, L=7 U is selected (simply by "trial and error") for the server arrangements shown in FIGS. 3A-3B. The hose of every GPU box can reach a port on a rack manifold, given the hose coverage range is +/−2 U.

Figures 4A, 4B:
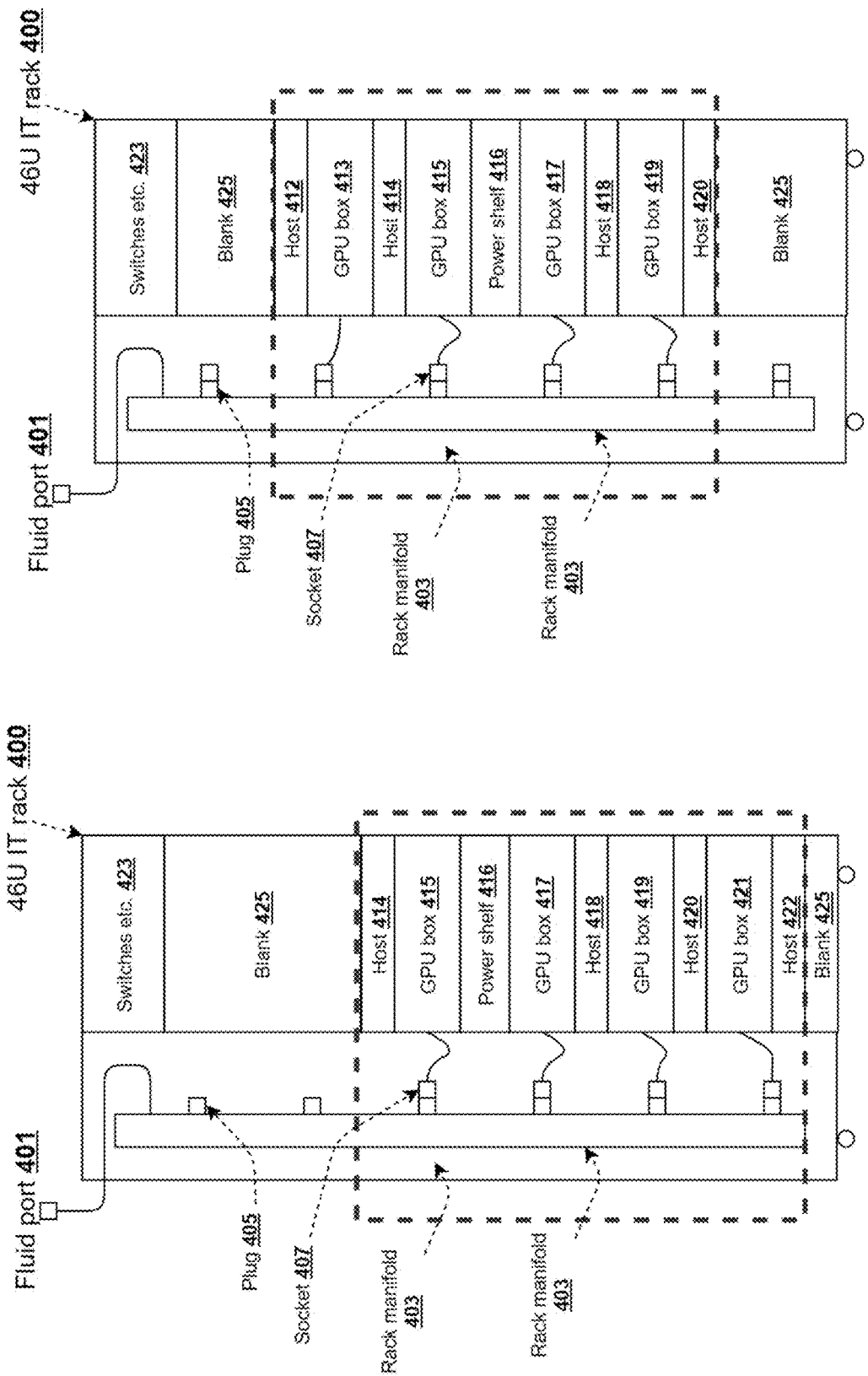
FIGS. 4A-4B show partially occupied server arrangements that can be supported using a rack manifold, according to an embodiment of the present disclosure.

FIGS. 4A-4B show partially occupied server arrangements that can be supported using the same rack manifold 403, according to an embodiment of the present disclosure. In this embodiment, the rack manifold 403 is fluidly coupled with a fluid port 401 and includes a number of plugs 405 corresponding to distributing ports, that can fluidly connect with sockets 407. The sockets can be connected to the servers or GPU boxes via a flexible hose, as disclosed above. In this embodiment, the IT rack 400 includes a section for switches 423 and cable management kits, a power shelf 416, and a portion of blank space 425. In the embodiment shown in FIG. 4A, the IT rack 400 also includes hosts 414, 418, 420, 422 and GPU boxes 415, 417, 419, 421 with asymmetric arrangement. In the embodiment shown in FIG. 4B, a different symmetric arrangement of servers includes hosts 412, 414, 418, 420 and GPU boxes 413, 415, 417, and 419. As can be seen in these figures, the same rack manifold can support both server arrangements, although only four distribution ports are required in each case. Thus, a smaller rack manifold having only four distribution ports could be used in each arrangement, if the rack manifold were movable within the IT rack 400.

In some embodiments, the spacing L between the distribution ports depends on the U-height of the GPU box and host, and the hose coverage range of a server. With those two values locked down, the spacing L can be determined. Furthermore, with the number of GPU boxes decided (e.g., maximum 4 GPU boxes to be mounted in a rack), then the specification of the rack manifold can be fully determined including port spacing, port number and length. The rack manifold with this design can support all the different the server arrangements mentioned in the present disclosure.

Figures 5A, 5B:
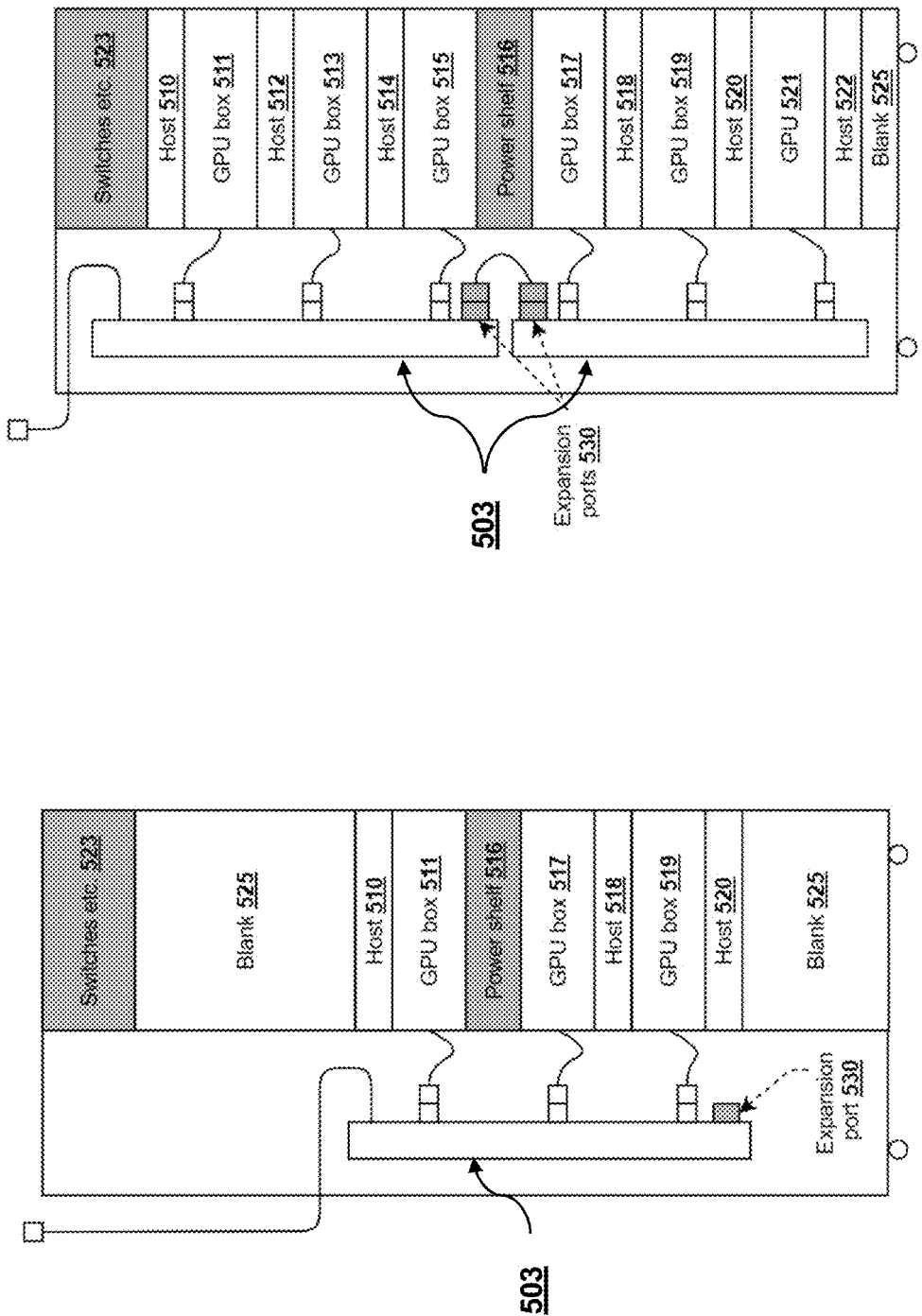
FIG. 5A shows how a single rack manifold can support a partially occupied server arrangement, according to an embodiment of the present disclosure.
FIG. 5B shows how two rack manifolds in series can support a server arrangement, according to an embodiment of the present disclosure.

FIG. 5A shows how a single rack manifold 503 can support a partially occupied server arrangement, according to an embodiment of the present disclosure. In this embodiment, a single rack manifold with three distribution ports can support the server arrangement where the IT rack services three hosts 510, 518, 520, three GPU boxes 511, 517, 519, and a power shelf 516. The remainder of the IT rack includes space for switches 523 and other components, as well as blank space 525. As shown in this embodiment, the manifolds can be designed much shorter than the height of the IT rack, depending on the rack space occupation. The rack manifold can include an expansion port 530, which can allow it to connect in series with another rack manifold. In the case of an inlet manifold, the expansion port can be a fluid outlet port that can connect with an inlet port of another inlet manifold. In the case of an outlet manifold, the expansion port can be a fluid inlet port that can connect with an outlet port of another outlet manifold.

FIG. 5B shows how two rack manifolds 503 in series can support a server arrangement, according to an embodiment of the present disclosure. In this embodiment, a pair of rack manifolds 503, each with three distribution ports, can support the server arrangement where the IT rack includes space for switches 523, a blank space 525, a power shelf 516, six hosts 510, 512, 514, 518, 520, 522, and six GPU boxes 511, 513, 515, 517, 519, 521. In this embodiments, the two rack manifolds 503 are connected and work in series using the expansion ports 530. In some embodiments, the expansion ports 530 can have a larger diameter than the distribution ports going to the GPU boxes.

In some embodiments, a single short rack manifold can be used for a smaller number of servers, and after a certain period, more servers can be deployed and a second short rack manifold can be added in the same IT rack to connect with the first one in series. In order to accommodate the second rack manifold, the original rack manifold can be moved up in order to make space for the second rack manifold to be mounted below. In the images shown in FIGS. 5A and 5B only inlet manifolds are shown. However, the outlet manifolds can follow the same method.

Figure 6:
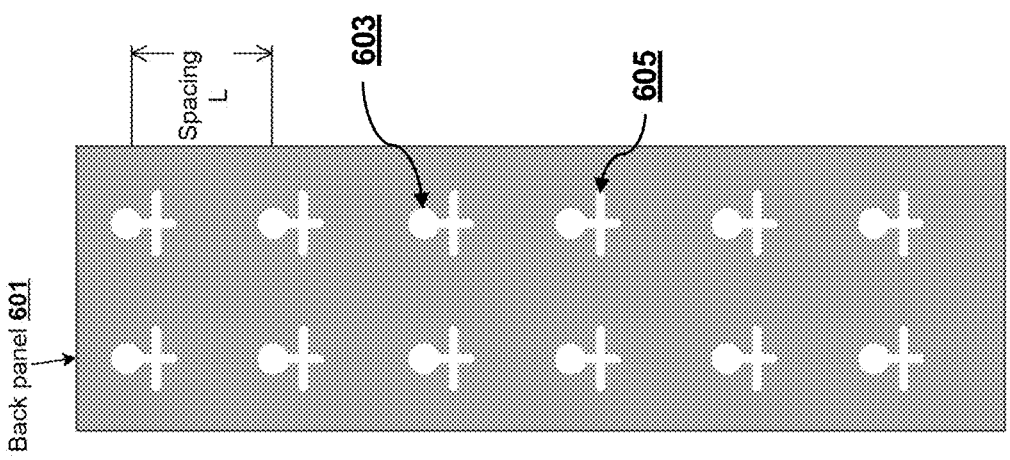
FIG. 6 shows an example pack panel of an electronic rack, according to an embodiment of the present disclosure.

FIG. 6 shows an example pack panel 601 of an electronic rack, according to an embodiment of the present disclosure. In this embodiment, the back panel 601 defines a number of receiving openings 603, which are each connected to a number of slots 605. The receiving openings 603 can be large enough to receive a head portion of a threaded stud, which functions as the mounting mechanism of the rack manifolds. The slots 605 can be connected to the receiving openings and can be larger than a diameter of the shaft of a threaded stud but smaller than the head portion of the threaded stud, such that the threaded stud can be inserted within the receiving openings 603 and secured into place within the slots 605. In this particular embodiment, the slots 605 are cross-shaped openings defined in the back panel 601. The receiving openings 603 can be spaced a distance L, which is the same distance as the distributing ports of the rack manifold, so that the rack manifold can be mounted at the proper location within the IT rack. In some embodiments, the back panel is mounted to the IT rack first, and then the rack manifold(s) are mounted on the back panel in the desired location, depending on the server arrangement. The openings can be sized and shaped so that the rack manifold can easily be installed and removed, as needed. The number of mounting holes or openings 603 can depend on the maximum number of GPU boxes within the IT rack.

Figure 7A:
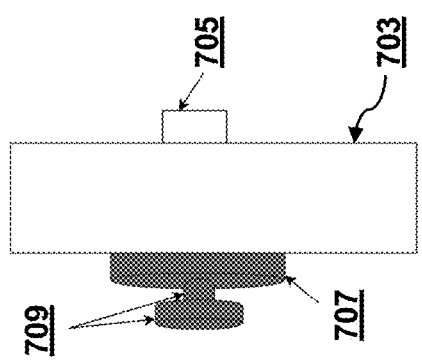
FIGS. 7A-7B show an example mounting mechanism for mounting a rack manifold to a back panel of an electronic rack, according to an embodiment of the present disclosure.
Figure 7B:
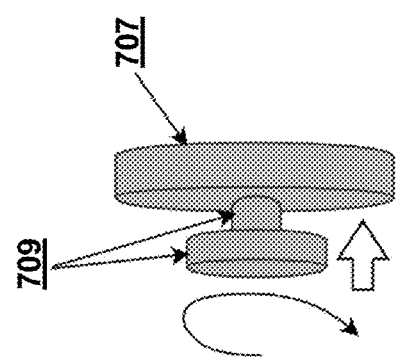

FIGS. 7A-7B show an example of mounting mechanism for mounting a rack manifold to a back panel of an electronic rack, according to an embodiment of the present disclosure. FIG. 7A shows a threaded stud 709, having a head portion and a threaded shaft portion, secured to a substrate 707. The substrate 707 is in turn secured to the rack manifold 703 on the opposite surface as the distributing ports 705. As shown in FIG. 7B, the threaded stud can travel closer to its substrate by rotation, so that the rack manifold can be fastened to the back panel once positioned. These images are for illustration only, and one skilled in the art will recognize that a rack manifold 703 can have more than one distributing port 705, and various other designs of a threaded stud or screw can be implemented.

Figure 8C:
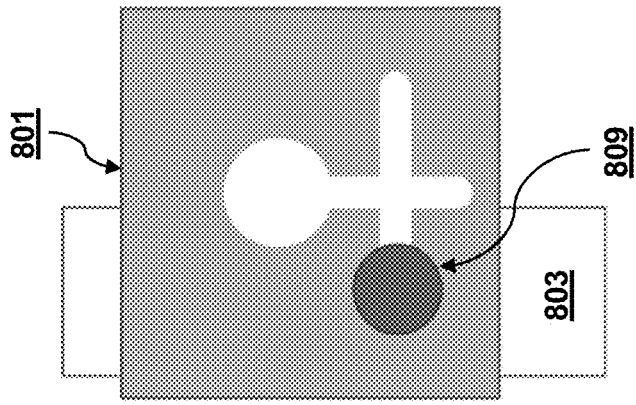
FIGS. 8A-8C show example positions of the rack manifold with respect to the back panel of an electronic rack, according to an embodiment of the present disclosure.
Figure 8B:
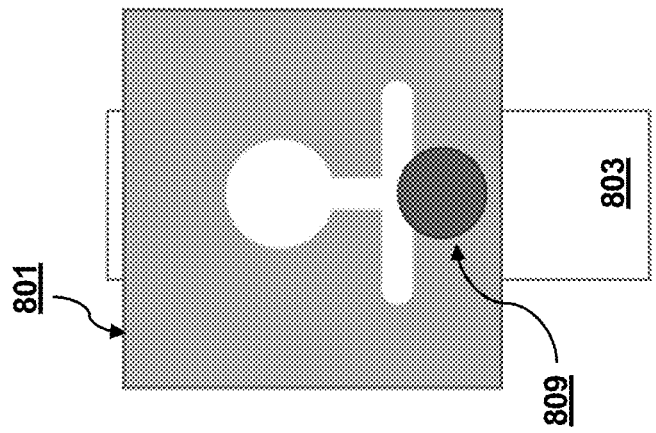
Figure 8A:
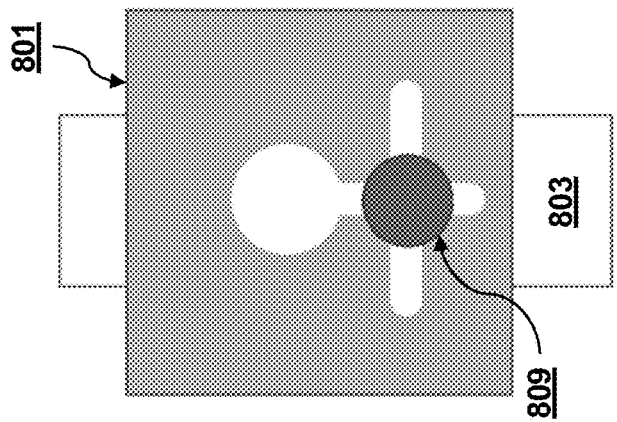

FIGS. 8A-8C show example positions of the rack manifold 803 with respect to the back panel 801 of an electronic rack, according to an embodiment of the present disclosure. In this embodiment, the slot portion defined within the back panel 801 can be cross-shaped, such that the threaded stud 809 can be positioned at a number of different locations within the slot. This particular embodiment allows for slight adjustments of the rack manifold's location vertically (e.g. +/−0.5 U) or horizontally when mounting in the rack. As can be seen, the rounded portion of the opening in the back panel 801 can be larger than the cap of the threaded stud 809 so that it is able to pass through the opening, and the pin of the stud can slide along the cross-shaped slots horizontally and vertically. The length of the cross-shaped opening can be relatively small, in some embodiments (e.g., 0.5 U).

Figure 9:
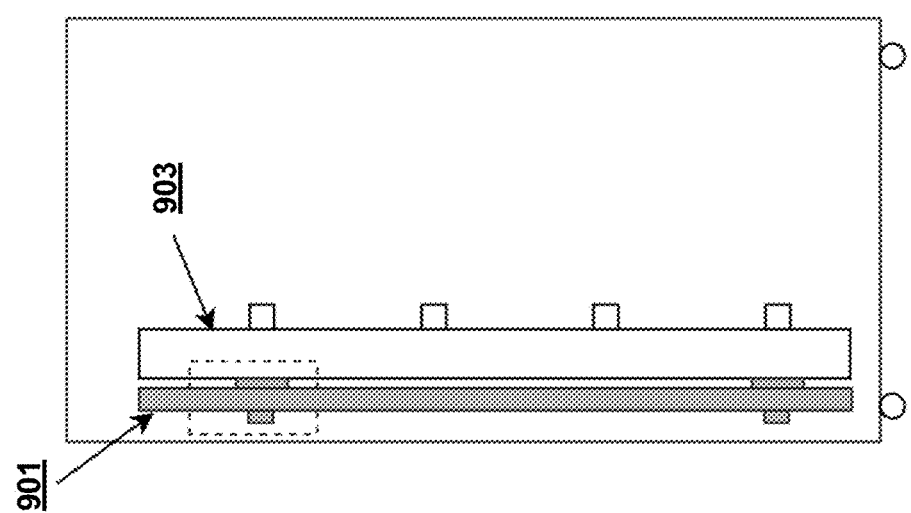
FIG. 9 shows a side view of a rack manifold mounted to the back panel of an electronic rack, according to an embodiment of the present disclosure.

FIG. 9 shows a side view of a rack manifold 903 mounted to the back panel 901 of an electronic rack, according to an embodiment of the present disclosure. As will be appreciated, the rack manifold 903 shown can be an inlet or an outlet manifold, and a corresponding outlet or inlet manifold can also be included having the same or substantially the same design.

Figure 10:
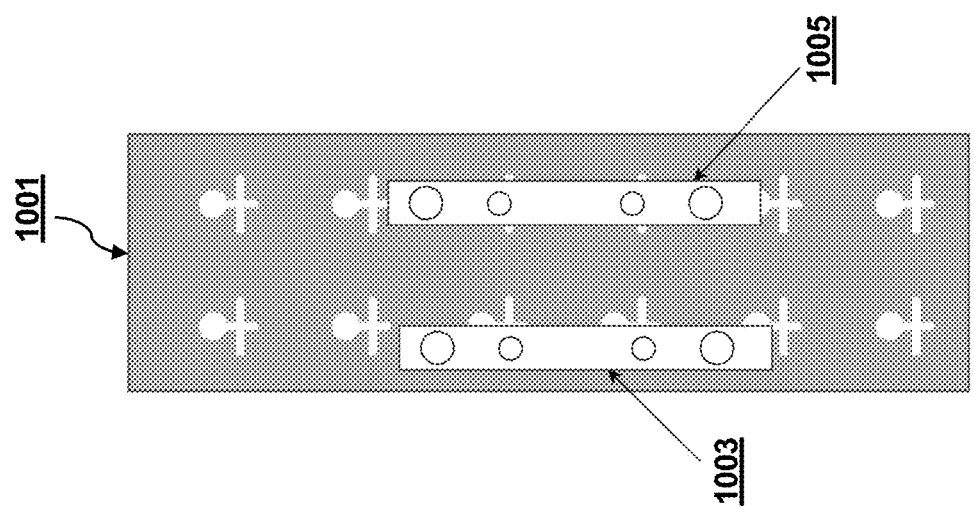
FIG. 10 shows how an inlet manifold and outlet manifold can be mounted at different heights with respect to the back panel of an electronic rack, according to an embodiment of the present disclosure.

FIG. 10 shows how an inlet manifold 1003 and outlet manifold 1005 can be mounted at different heights with respect to the back panel 1001 of an electronic rack, according to an embodiment of the present disclosure. As discussed above, the shape of the cross-shaped openings in the back panel 1001 allows the manifolds to move horizontally and vertically by a relatively small amount. This can allow for the creation of additional space within an IT rack for service. The vertical distance and horizontal distance between the inlet manifold and the outlet manifold can be changeable when mounted, which allows for more spade for service.

Figure 11:
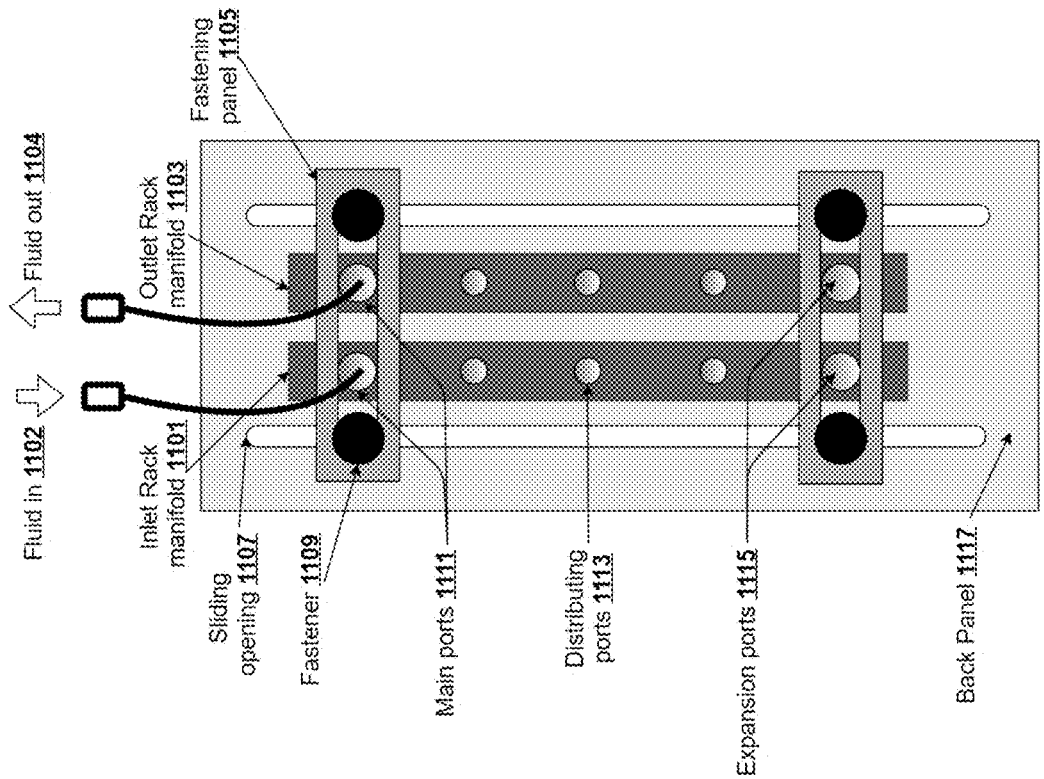
FIG. 11 shows a technique for mounting rack manifolds to a back panel using fastening panels, according to an embodiment of the present disclosure.

FIG. 11 shows a technique for mounting rack manifolds to a back panel 1117 using fastening panels 1105, according to an embodiment of the present disclosure. In this embodiment, an inlet rack manifold 1101 and an outlet rack manifold 1103 are each secured or mounted to a back panel 1117 using fastening panels 1105. Each of the rack manifolds 1101, 1103 includes a main port 1111, a number of distributing ports 1113, and can optionally include expansion ports 1115 that allow them to be connected in series with additional rack manifolds. The main port 1111 for the inlet rack manifold 1101 can be a fluid inlet port connected to a fluid in line 1102, while the main port 1111 for the outlet rack manifold 1103 can be a fluid outlet port connected to a fluid out line 1104. As discussed above, each of the distributing ports can be connected to a cooling system of an electronic device, or server, within an IT rack.

In this example embodiment, the inlet rack manifold 1101 and the outlet rack manifold 1103 can be positioned between the two fastening panels 1105 and the back panel 1117, and the fastening panels can be secured to the back panel 1117 using fasteners 1109. This can secure the inlet rack manifold 1101 and the outlet rack manifold 1103 in the desired positon within an IT rack. In some embodiments, the fastening panels 1105 can engage with or receive portions or all of the main ports 1111 and/or the expansion ports 1115, or some other feature of the manifolds, in order to hold them in place. In this example embodiment, the fasteners can secure to the back panel through sliding openings 1107, which can be vertically extending openings that allow the fastening panels 1105 and the rack manifolds 1101, 1103 to move vertically with respect to the back panel. If the fastening panel 1105 is oriented horizontally in this embodiment, then the inlet rack manifold 1101 and the outlet rack manifold 1103 will be positioned at the same height.

Figure 12:
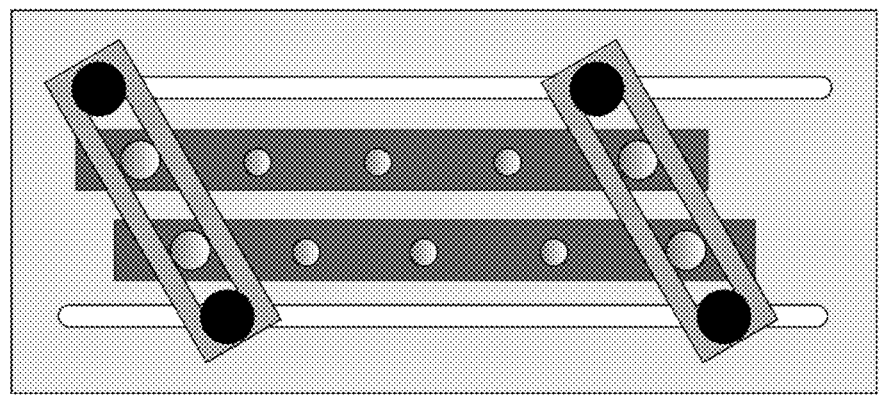
FIG. 12 shows an alternative arrangement of rack manifolds mounted to a back panel using fastening panels, according to an embodiment of the present disclosure.

FIG. 12 shows an alternative arrangement of the rack manifolds of FIG. 11, according to an embodiment of the present disclosure. In this example embodiment, the same elements and components are used as in FIG. 12, but the fastening panels are oriented diagonally with respect to the vertically extending sliding openings, such that the outlet rack manifold is positioned higher than the inlet rack manifold.

Figure 13:
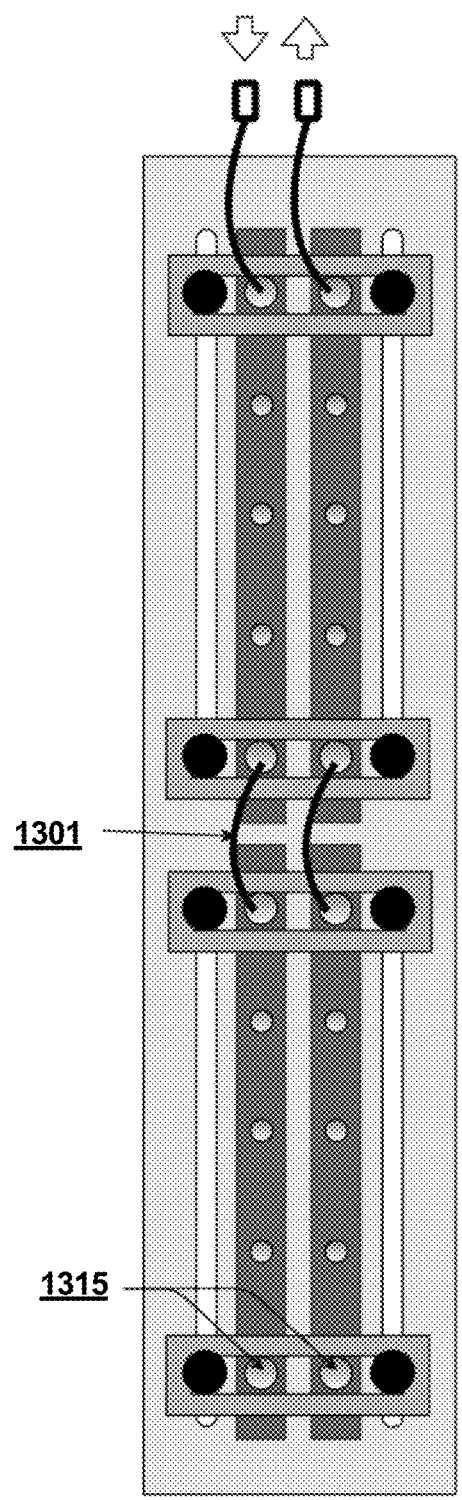
FIG. 13 shows a technique for mounting two sets of manifolds in series, according to an embodiment of the present disclosure.

FIG. 13 shows a technique for mounting two sets of manifolds in series, according to an embodiment of the present disclosure. In this example embodiment, two sets of rack manifolds and fastening panels, as shown in FIG. 11, are connected in series by connecting the expansion ports of one set of rack manifolds with the main ports of a second set of rack manifolds. This connection can be done using a section of tubing 1301, in some embodiments. In this example embodiment, the expansion ports 1315 of the second set of rack manifolds are sealed.

One skilled in the art would recognize that various adjustments can be made to the system within the scope of this disclosure.

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a fluid manifold. The fluid manifold includes a fluid port near a first end of a fluid manifold, and the fluid manifold has an elongated design extending from the first end to a second end. The fluid manifold also includes a number of distributing ports disposed along a length of the fluid manifold between the first end and the second end, where each distributing port is configured to engage with a flexible hose connected to a cooling system of an electronic device. The fluid manifold also includes a mounting mechanism configured to engage with an opening defined in a portion of a back panel of an electronic rack. In some embodiments, the fluid port is a fluid inlet port and the fluid manifold is a fluid inlet manifold. In some embodiments, the fluid inlet manifold also includes a fluid outlet port near the second end of the fluid manifold, and the fluid outlet port is configured to fluidly couple with a fluid inlet port of a second fluid inlet manifold. In some embodiments, the fluid port is a fluid outlet port and the fluid manifold is a fluid outlet manifold. In some embodiments, the fluid outlet manifold also includes a fluid inlet port near the second end of the fluid manifold, where the fluid inlet port is configured to fluidly couple with a fluid outlet port of a second fluid outlet manifold. In some embodiments, each of the distributing ports are equally spaced apart from one another by distance that is a multiple of a minimum height of an electronic device within the electronic rack. In some embodiments, the fluid manifold can be mounted at a number of different locations with respect to the back panel of the electronic rack, using the mounting mechanism. In some embodiments, the distributing ports of the fluid manifold are configured to engage with multiple different arrangements of cooling systems of electronic devices within the electronic rack. In some embodiments, mounting mechanism includes a number of threaded studs, and each threaded stud is configured to engage with an opening defined in the back panel of the electronic rack.

Another embodiment provides for a fluid distribution system. The fluid distribution system includes an inlet manifold having a fluid inlet port and a number of inlet distributing ports, where at least one inlet distributing port is configured to engage with a fluid inlet line connected to a cooling system of an electronic device. The fluid distribution system also includes an outlet manifold having a fluid outlet port and a number of outlet distributing ports, where at least one outlet distributing port is configured to engage with a fluid outlet line connected to the cooling system of the electronic device. The fluid distribution system also includes an inlet manifold mounting mechanism configured to engage with a portion of the inlet manifold, and an outlet manifold mounting mechanism configured to engage with a portion of the outlet manifold. The fluid distribution system also includes a back panel of an electronic rack. The back panel defines a number of openings configured to receive the inlet manifold mounting mechanism and the outlet manifold mounting mechanism. In some embodiments, the inlet manifold mounting mechanism includes a first set of threaded studs, and the outlet manifold mounting mechanism includes a second set of threaded studs, where each threaded stud has a head portion positioned at one end of a threaded shaft. In some embodiments, the back panel defines a number of openings having a receiving opening and a slot. The receiving opening is larger than the head portion of the threaded studs, and the slot is larger than a diameter of the threaded shaft and smaller than the head portion. In some embodiments, the slot of each of the openings allows one of the mounting mechanisms to rest at a number of locations with respect to the back panel. In some embodiments, the slot is a cross-shaped opening defined in the back panel. In some embodiments, the fluid distribution system also includes a fluid outlet port formed in the inlet manifold and configured to be fluidly coupled with a fluid inlet port of a second inlet manifold. In some embodiments, the fluid distribution system also includes a fluid inlet port formed in the outlet manifold and configured to be fluidly coupled with a fluid outlet port of a second outlet manifold. In some embodiments, the at least one inlet manifold and the at least one outlet manifold can be mounted to the back panel of the electronic rack at different heights with respect to each other.

Another embodiment provides for a fluid distribution system for an electronic rack. The fluid distribution system includes an inlet manifold having a fluid inlet port and a number of inlet distributing ports. At least one inlet distributing port can engage with a fluid inlet line connected to a cooling system of an electronic device. The system also includes an outlet manifold having a fluid outlet port and a number of outlet distributing ports. At least one outlet distributing port can engage with a fluid outlet line connected to the cooling system of the electronic device. The system also includes at least two fastening panels configured to engage with the first inlet manifold and the first outlet manifold. The system also includes a back panel of an electronic rack. The back panel defines a plurality of openings. The system also includes a number of fasteners configured to engage with the fastening panels and the openings defined within the back panel in order to secure the inlet manifold and the outlet manifold with respect to the back panel. In some embodiments, the fluid distribution system also includes a second inlet manifold having a fluid inlet port and a number of inlet disturbing ports. The fluid inlet port of the second inlet manifold can fluidly couple with a fluid outlet port of the first inlet manifold. In some embodiments, the fluid distribution system also includes a second outlet manifold having a fluid outlet port and a number of outlet distributing ports. The fluid outlet port of the second outlet manifold can fluidly couple with a fluid inlet port of the first outlet manifold. In some embodiments, the openings defined within the back panel include a pair of vertically extending openings, and the two fastening panels can be oriented diagonally with respect to the vertically extending openings. In some embodiments, the fastening panels and the fasteners can secure the inlet manifold and the outlet manifold at different vertical and horizontal positions with respect to the back panel of the electronic rack.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A fluid distribution system, comprising:
   at least one inlet manifold having a fluid inlet port and a plurality of inlet distributing ports, the plurality of inlet distributing ports having a first diameter, and wherein at least one inlet distributing port is configured to engage with a fluid inlet line connected to a cooling system of an electronic device;
   at least one outlet manifold having a fluid outlet port and a plurality of outlet distributing ports, the plurality of outlet distributing ports having a second diameter, wherein at least one outlet distributing port is configured to engage with a fluid outlet line connected to the cooling system of the electronic device, and wherein one or more of the at least one inlet manifold and the at least one outlet manifold comprises an expansion port having a third diameter larger than the first diameter or the second diameter and configured to connect in series with another expansion port of another fluid manifold;
   an inlet manifold mounting mechanism configured to engage with a portion of the inlet manifold;
   an outlet manifold mounting mechanism configured to engage with a portion of the outlet manifold; and
   a back panel of an electronic rack, the back panel defining a plurality of openings configured to receive the inlet manifold mounting mechanism and the outlet manifold mounting mechanism.

2. The fluid distribution system of claim 1, wherein the inlet manifold mounting mechanism includes a first set of threaded studs, and the outlet manifold mounting mechanism includes a second set of threaded studs, each threaded stud having a head portion positioned at one end of a threaded shaft.

3. The fluid distribution system of claim 2, wherein the plurality of openings of the back panel include a receiving opening and a slot, the receiving opening being larger than the head portion of the threaded studs, and the slot being larger than a diameter of the threaded shaft and smaller than the head portion.

4. The fluid distribution system of claim 3, wherein the slot of each of the plurality of openings allows one of the mounting mechanisms to rest at a plurality of locations with respect to the back panel.

5. The fluid distribution system of claim 4, wherein the slot is a cross-shaped opening defined in the back panel.

6. The fluid distribution system of claim 1, wherein the at least one inlet manifold and the at least one outlet manifold can be mounted to the back panel of the electronic rack at different heights with respect to each other.

7. The fluid distribution system of claim 1, wherein each of the plurality of inlet distributing ports or each of the plurality of outlet distributing ports are equally spaced apart from one another by distance that is a multiple of a minimum height of an electronic device within the electronic rack.

8. The fluid distribution system of claim 1, wherein fluid inlet port or the fluid outlet port has a fourth diameter equal to the third diameter.

9. The fluid distribution system of claim 8, wherein the first diameter equals the second diameter.

10. A fluid distribution system, comprising:
    at least one inlet manifold having a fluid inlet port, a plurality of inlet distributing ports, and an inlet manifold mounting mechanism engaged with a portion of the at least one inlet manifold, the plurality of inlet distributing ports having a first diameter, and wherein at least one inlet distributing port is configured to engage with a fluid inlet line connected to a cooling system of an electronic device; and at least one outlet manifold having a fluid outlet port, a plurality of outlet distributing ports, and an outlet manifold mounting mechanism engaged with a portion of the at least one outlet manifold, the plurality of outlet distributing ports having a second diameter, wherein at least one outlet distributing port is configured to engage with a fluid outlet line connected to the cooling system of the electronic device, and wherein one or more of the at least one inlet manifold and the at least one outlet manifold comprises an expansion port having a third diameter larger than the first diameter or the second diameter and configured to connect in series with another expansion port of another fluid manifold, wherein the inlet manifold mounting mechanism and the outlet manifold mounting mechanism are configured to engage with at least one opening defined in a back panel of an electronic rack.

11. The fluid distribution system of claim 10, wherein fluid inlet port and the fluid outlet port have a fourth diameter equal to the third diameter.

12. The fluid distribution system of claim 11, wherein the first diameter equals the second diameter.

13. The fluid distribution system of claim 10, further comprising the at least one opening of the outlet manifold mounting mechanism configured to receive the inlet manifold mounting mechanism and the outlet manifold mounting mechanism.

14. The fluid distribution system of claim 13, wherein the inlet manifold mounting mechanism includes a first set of threaded studs, and the outlet manifold mounting mechanism includes a second set of threaded studs, each threaded stud having a head portion positioned at one end of a threaded shaft.

15. The fluid distribution system of claim 14, wherein the at least one opening of the back panel includes a plurality of openings having a receiving opening and a slot, the receiving opening being larger than the head portion of the threaded studs, and the slot being larger than a diameter of the threaded shaft and smaller than the head portion.

16. The fluid distribution system of claim 15, wherein the slot of each of the plurality of openings allows one of the mounting mechanisms to rest at a plurality of locations with respect to the back panel.

17. The fluid distribution system of claim 16, wherein the slot is a cross-shaped opening defined in the back panel.

18. The fluid distribution system of claim 10, wherein the at least one inlet manifold and the at least one outlet manifold can be mounted to the back panel of the electronic rack at different heights with respect to each other.

19. The fluid distribution system of claim 10, wherein each of the plurality of inlet distributing ports or each of the plurality of outlet distributing ports are equally spaced apart from one another by distance that is a multiple of a minimum height of an electronic device within the electronic rack.

* * * * *